(12) United States Patent
Sato

(10) Patent No.: US 11,804,735 B2
(45) Date of Patent: Oct. 31, 2023

(54) POWER TRANSMISSION APPARATUS, METHOD FOR CONTROLLING POWER TRANSMISSION APPARATUS, AND RECORDING MEDIUM

(71) Applicant: CANON KABUSHIKI KAISHA, Tokyo (JP)

(72) Inventor: Ryosuke Sato, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 444 days.

(21) Appl. No.: 17/174,004

(22) Filed: Feb. 11, 2021

(65) Prior Publication Data

US 2021/0257863 A1    Aug. 19, 2021

(30) Foreign Application Priority Data

Feb. 13, 2020    (JP) .................. 2020-022902

(51) Int. Cl.
  *H02J 7/00* (2006.01)
  *H02J 50/60* (2016.01)
  *H02J 50/10* (2016.01)
  *G01R 19/165* (2006.01)
  *H04B 5/00* (2006.01)
  *H02J 50/80* (2016.01)

(52) U.S. Cl.
  CPC ........ *H02J 50/60* (2016.02); *G01R 19/16538* (2013.01); *H02J 50/10* (2016.02); *H02J 50/80* (2016.02); *H04B 5/0037* (2013.01); *H04B 5/0081* (2013.01)

(58) Field of Classification Search
  USPC .................. 320/106, 107, 108, 109, 110, 112
  See application file for complete search history.

(56) References Cited

U.S. PATENT DOCUMENTS

2015/0280453 A1* 10/2015 Ikefuji ................ H02J 7/00034
                                                                320/108
2019/0148967 A1*  5/2019 Bae ........................ H02J 50/80
                                                                320/108

(Continued)

FOREIGN PATENT DOCUMENTS

JP    2017070074 A    4/2017
JP    2017209011 A  * 11/2017  ............ B60L 11/182
JP    2018512036 A    4/2018

*Primary Examiner* — Brian Ngo
(74) *Attorney, Agent, or Firm* — Canon U.S.A., Inc. IP Division

(57) ABSTRACT

A power transmission apparatus wirelessly communicates with a power reception apparatus using an antenna, wirelessly transmits power to the power reception apparatus using the antenna, measures, in a period during which the transmission of the power is stopped, one or both of a voltage and a current output from the antenna, performs, based on a measurement result obtained by the measurement, a determination process for determining that an object different from the power reception apparatus is present, restricts, in a case where it is determined that an object different from the power reception apparatus is present as a result of the determination process performed by the first determination unit, the transmission of the power, and controls the first determination unit not to use in the determination process the measurement result obtained by the measurement in a period during which communication is performed.

17 Claims, 9 Drawing Sheets

(56) References Cited

U.S. PATENT DOCUMENTS

2023/0084679 A1* 3/2023 Lee .................. H02J 50/10
320/108
2023/0134962 A1* 5/2023 Lim .................. H02J 50/90
320/108

* cited by examiner

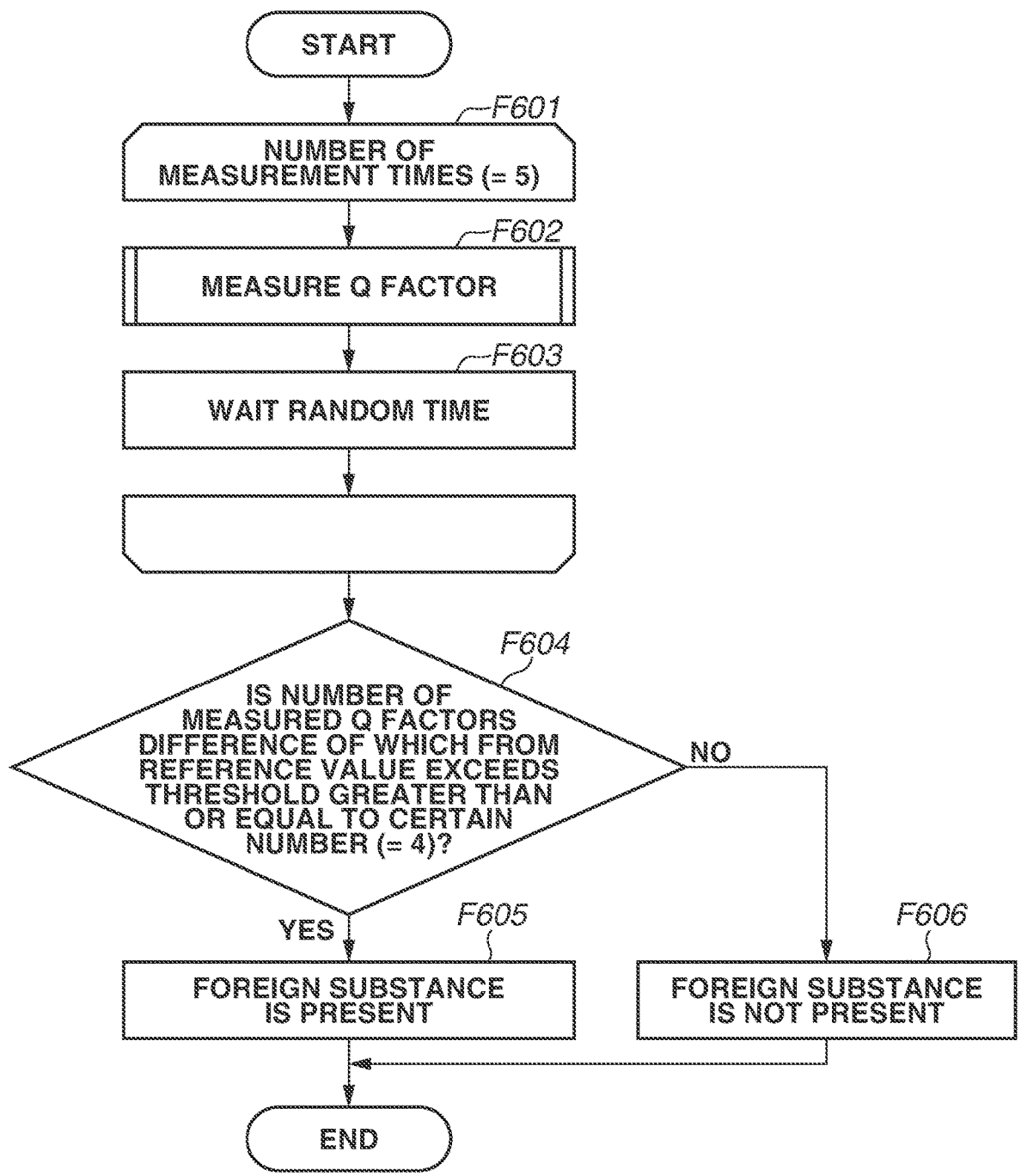

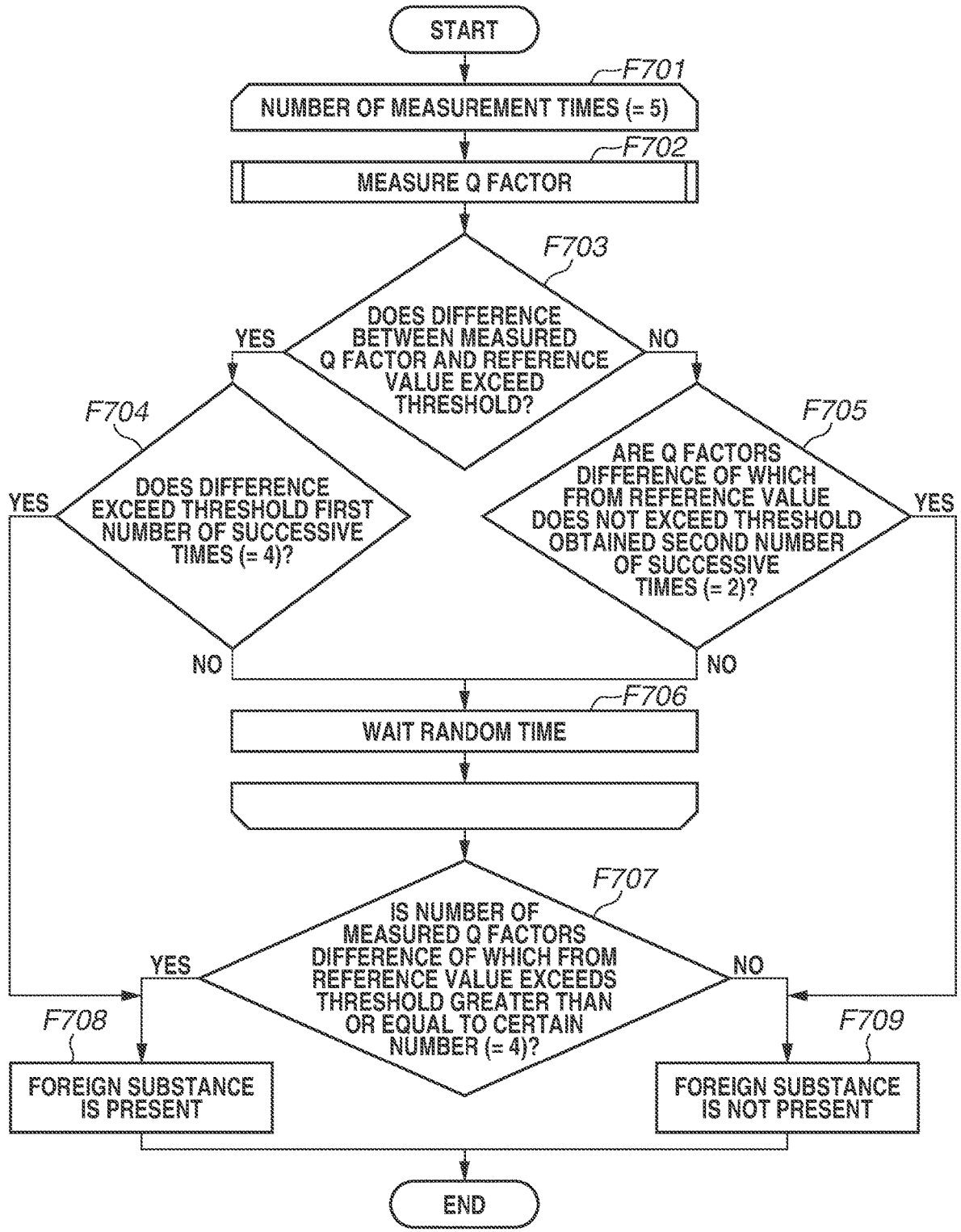

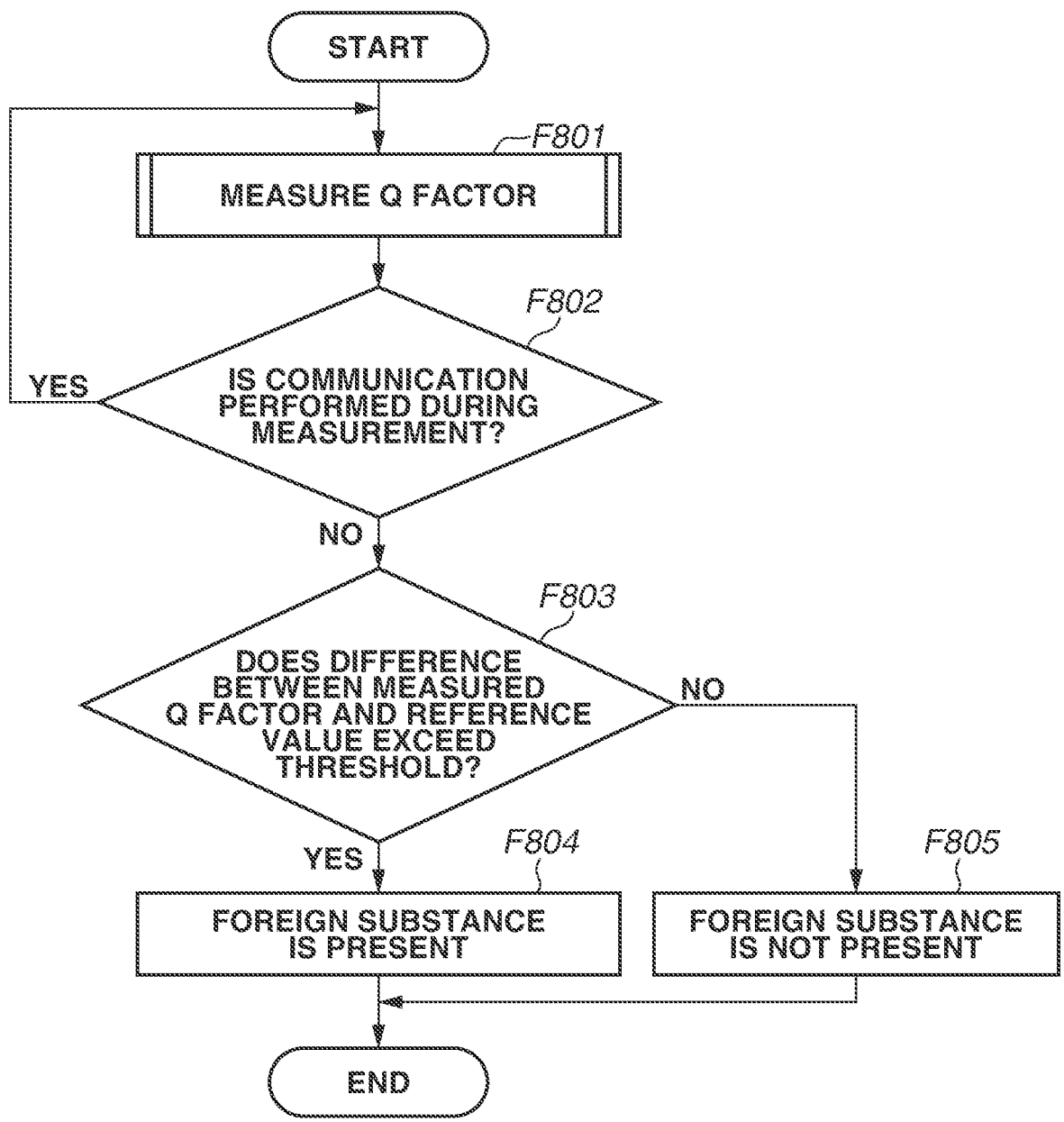

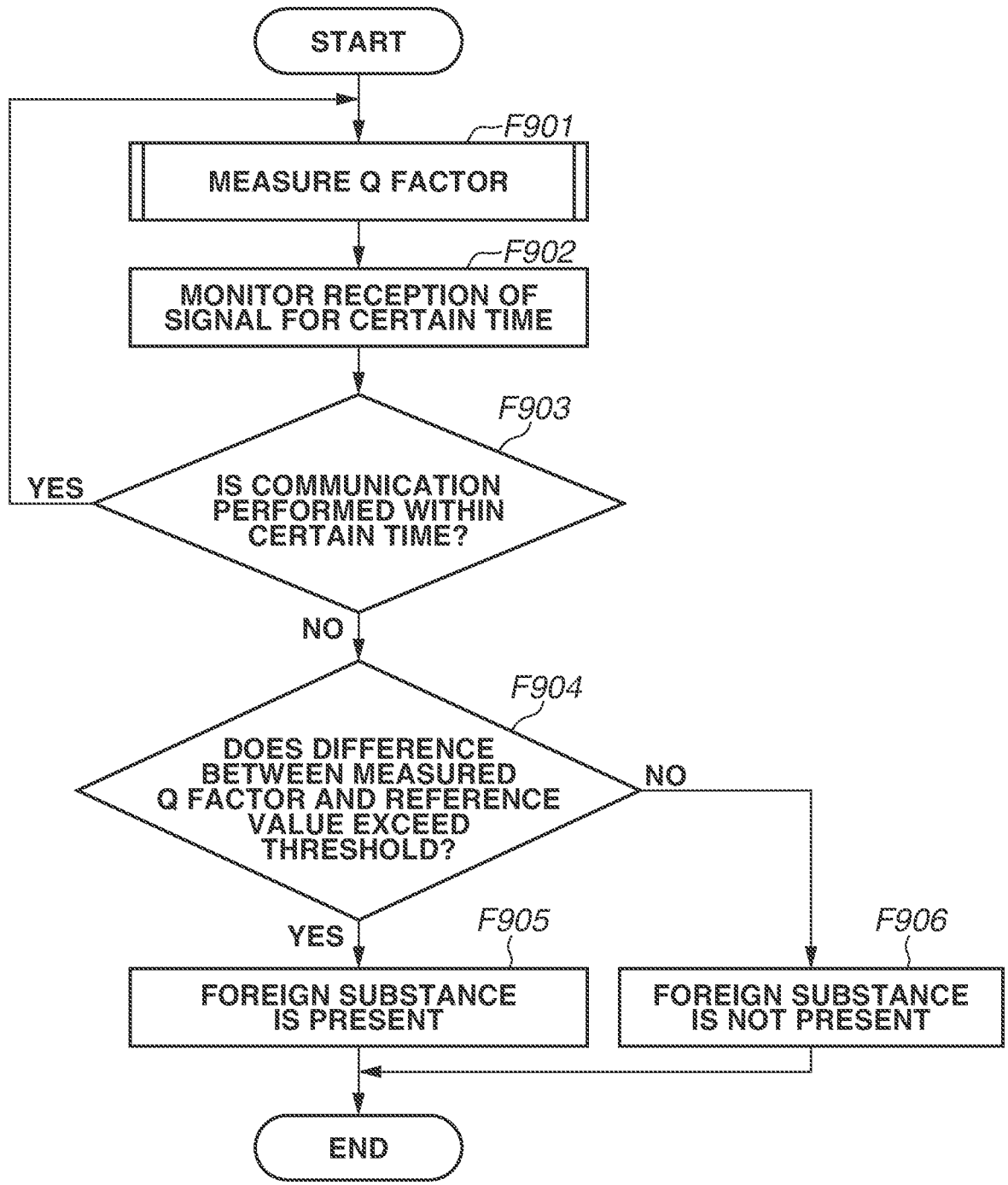

POWER TRANSMISSION APPARATUS, METHOD FOR CONTROLLING POWER TRANSMISSION APPARATUS, AND RECORDING MEDIUM

BACKGROUND

Field

The present disclosure relates to a power transmission apparatus, a method for controlling a power transmission apparatus, and a recording medium.

Description of the Related Art

In recent years, a technique for a wireless power transmission system has been widely developed. Japanese Patent Application Laid-Open No. 2017-70074 discusses a power transmission apparatus and a power reception apparatus compliant with a standard formulated by a wireless charging standards body called the Wireless Power Consortium (WPC) (hereinafter referred to as the "WPC standard"). Communication between the power transmission apparatus and the power reception apparatus is achieved by superimposing a signal on power to be transmitted, using an antenna for use in wireless power transmission.

Japanese Patent Application Laid-Open No. 2017-70074 discusses a method for, in a case where an object (hereinafter referred to as a "foreign substance") different from a power reception apparatus is present in the range where a power transmission apparatus can transmit power, specifying the presence of the foreign substance, and based on the result of the specifying, restricting the transmission of power.

Japanese Unexamined Patent Application Publication No. 2018-512036 discusses a method for, based on the amount of attenuation in the voltage value of a power transmitter in the period during which the voltage of the power transmitter gradually decreases after the transmission of power is stopped, determining whether an object is present near the power transmitter.

SUMMARY

In a case where an antenna for use in wireless power transmission is used in communication between a power transmission apparatus and a power reception apparatus, the following issue arises in a method discussed in Japanese Unexamined Patent Application Publication No. 2018-512036. That is, if communication using an antenna for use in wireless power transmission is performed when a voltage is measured in the period during which the transmission of power is stopped, a change in the amplitude of a signal for the communication is reflected on the power, i.e., the voltage to be measured. Thus, the voltage to be measured is influenced not only by an object but also by communication. Then, if the presence of an object is determined based on the measured voltage, the accuracy of the detection of an object decreases. Specifically, for example, an object may not detected in a case where an object is present, or an object may be erroneously detected even though an object is not present. Then, in a case where this method is applied to the detection of a foreign substance, the accuracy of the detection of a foreign substance may deteriorate. Even when the measurement target is a current, a similar issue arises.

According to various embodiments of the present disclosure, a power transmission apparatus includes a communication unit configured to wirelessly communicate with a power reception apparatus using an antenna, and a power transmission unit configured to wirelessly transmit power to the power reception apparatus using the antenna. The power transmission apparatus also includes a measurement unit configured to, in a period during which the transmission of the power from the power transmission unit is stopped, measure one or both of a voltage and a current output from the antenna. The power transmission apparatus further includes a first determination unit configured to perform, based on a measurement result obtained by the measurement performed by the measurement unit, a determination process for determining that an object different from the power reception apparatus is present. Additionally, the power transmission apparatus includes a restriction unit configured to, in a case where it is determined that an object different from the power reception apparatus is present as a result of the determination process performed by the first determination unit, restrict the transmission of the power from the power transmission unit, and a control unit configured to control the first determination unit not to use in the determination process the measurement result obtained by the measurement performed by the measurement unit in a period during which communication is performed by the communication unit.

Further features of the present disclosure will become apparent from the following description of exemplary embodiments with reference to the attached drawings.

BRIEF DESCRIPTION OF THE DRAWINGS

FIG. 6 is a flowchart illustrating a foreign substance detection process according to the first exemplary embodiment.

FIG. 7 is a flowchart illustrating a foreign substance detection process according to a modification of the first exemplary embodiment.

FIG. 8 is a flowchart illustrating a foreign substance detection process according to a second exemplary embodiment.

FIG. 9 is a flowchart illustrating a foreign substance detection process according to a modification of the second exemplary embodiment.

DESCRIPTION OF THE EMBODIMENTS

Exemplary embodiments will be described below with reference to the drawings. It is to be understood that components described in the following description illustrate features of example embodiments of the present disclosure, and do not limit the scope of the present invention to these described example embodiments.

Figure 1:
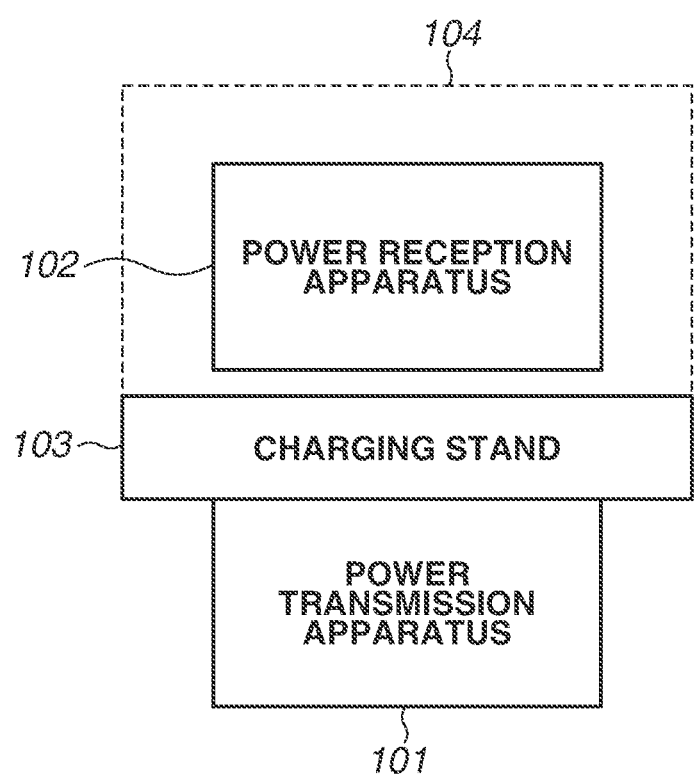
FIG. 1 is a diagram illustrating an example of a configuration of a wireless power transmission system.

A first exemplary embodiment will be described. FIG. 1 illustrates an example of the configuration of a wireless charging system (a wireless power transmission system) according to the present exemplary embodiment. As an example, this system includes a power transmission apparatus 101 and a power reception apparatus 102. Hereinafter, a power reception apparatus will occasionally be referred to as an "RX", and a power transmission apparatus will occasionally be referred to as a "TX". The RX 102 is an electronic device that receives power from the TX 101 and charges a built-in battery. The TX 101 is an electronic device that wirelessly transmits power to the RX 102 placed on a charging stand 103. The RX 102 can receive power from the TX 101 in a range 104. An example of the RX 102 is a smartphone, and an example of the TX 101 is an accessory device for charging the smartphone. Alternatively, each of the RX 102 and the TX 101 may be a storage device such as a hard disk device or a memory device, or may be an information processing apparatus such as a personal computer (PC). Yet alternatively, each of the RX 102 and the TX 101 may be an image input apparatus such as an imaging apparatus (a camera or a video camera) or a scanner, or may be an image output apparatus such as a printer, a copying machine, or a projector. Yet alternatively, each of the RX 102 and the TX 101 may have the function of executing an application other than wireless charging. Yet alternatively, the TX 101 may be a smartphone. In this case, the RX 102 may be another smartphone, or may be wireless earphones. Yet alternatively, the RX 102 may be an automobile. Yet alternatively, the TX 101 may be a charger installed in a console in an automobile.

Although a single TX 101 and a single RX 102 are illustrated in the present exemplary embodiment, embodiments of the present disclosure can also be applied to a configuration in which a single TX 101 or different TXs 101 transmit power to a plurality of RXs 102.

In this system, based on a standard for wireless charging defined by the Wireless Power Consortium (WPC) (the WPC standard), wireless power transmission using an electromagnetic induction method for wireless charging is performed. That is, the RX 102 and the TX 101 perform wireless power transmission for wireless charging based on the WPC standard between a power reception coil (a power reception antenna) of the RX 102 and a power transmission coil (a power transmission antenna) of the TX 101. The wireless power transmission method is not limited to a method defined by the WPC standard, and may be another electromagnetic induction method, a magnetic field resonance method, an electric field resonance method, a microwave method, or a method using a laser. Although wireless power transmission is used for wireless charging in the present exemplary embodiment, wireless power transmission may be performed for use other than wireless charging.

The WPC standard defines the magnitude of power guaranteed when the RX 102 receives power from the TX 101, as a value termed guaranteed power (hereinafter referred to as "GP"). For example, the GP indicates the power value of power guaranteed to be output to a load (e.g., a circuit for charging) in the RX 102 even when the positional relationship between the RX 102 and the TX 101 changes and the power transmission efficiency between the power reception coil and the power transmission coil decreases. For example, in a case where the GP is 5 watts, and even when the positional relationship between the power reception coil and the power transmission coil changes and the power transmission efficiency decreases, the TX 101 transmits power by performing control so that 5 watts can be output to the load in the RX 102.

The RX 102 and the TX 101 according to the present exemplary embodiment perform communication for power transmission/reception control based on the WPC standard.

The communication for power transmission/reception control will now be described. The WPC standard defines a plurality of phases including the power transfer phase where power is transmitted, and phases before the power is transmitted. The phases before the power is transmitted include the (1) selection phase, the (2) ping phase, the (3) identification and configuration phase, the (4) negotiation phase, and the (5) calibration phase. Hereinafter, the identification and configuration phase will be referred to as the "I & C phase".

In the (1) selection phase, the TX 101 intermittently transmits an analog ping and detects that an object is present in a power transmittable range (e.g., the power reception apparatus 102 or a conductor piece is placed on the charging stand 103). That is, the analog ping is a detection signal for detecting the presence of an object. The TX 101 transmits the analog ping by applying a voltage or a current to the power transmission coil. The voltage or the current applied to the power transmission coil changes between a case where an object is placed on the charging stand 103 and a case where an object is not placed on the charging stand 103. Accordingly, the TX 101 detects one or both of the voltage value and the current value of the power transmission coil when the analog ping is transmitted. If the voltage value falls below a certain threshold, or if the current value exceeds a certain threshold, the TX 101 determines that an object is present. Then, the TX 101 transitions to the ping phase.

In the (2) ping phase, the TX 101 transmits a digital ping having power greater than that of the analog ping. The magnitude of the digital ping is sufficient power for a control unit of the RX 102 placed on the charging stand 103 to start. The RX 102 notifies the TX 101 of the magnitude of a power reception voltage. That is, the RX 102 transmits a signal strength packet (hereinafter referred to as an "SS packet") to the TX 101. As described above, the TX 101 receives a response from the RX 102 having received the digital ping, thereby recognizing that the object detected in the selection phase is the RX 102. When the TX 101 receives the notification of the power reception voltage value, the TX 101 transitions to the I & C phase.

In the (3) I & C phase, the TX 101 identifies the RX 102 and acquires device configuration information (capability information) from the RX 102. To this end, the RX 102 transmits an identification (ID) packet and a configuration packet to the TX 101. The ID packet includes identification information regarding the RX 102, and the configuration packet includes device configuration information (capability information) regarding the RX 102. Receiving the ID packet and the configuration packet, the TX 101 responds with an acknowledgement (ACK). Then, the I & C phase ends.

In the (4) negotiation phase, the value of the GP is determined based on the value of the GP requested by the RX 102 and the power transmission capability of the TX 101.

In the (5) calibration phase, based on the WPC standard, the RX 102 notifies the TX 101 of a reception power value using a received power packet. Then, the TX 101 acquires transmission power corresponding to the reception power and stores the transmission power in association with the reception power. Then, based on at least two pairs of the reception power and the transmission power, the TX 101 calculates and stores parameters for a foreign substance detection process based on power loss. In the present exemplary embodiment, the TX 101 calculates and stores parameters for a foreign substance detection process also in the power transfer phase. Foreign substance detection is the process of determining whether an object (hereinafter referred to as a "foreign substance") different from the RX 102 is present in the power transmittable range of the TX 101, or there is a possibility that a foreign substance is present in the power transmittable range.

In the power transfer phase, control for starting and continuing the transmission of power, and stopping the transmission of power due to foreign substance detection and full charge is performed.

The TX 101 and the RX 102 superimpose a signal related to this communication for power transmission/reception control on power based on the WPC standard and using the same antenna (coil) as wireless power transmission. Consequently, the TX 101 and the RX 102 can perform the communication for power transmission/reception control using the same antenna (coil) as wireless power transmission. The range where the TX 101 and the RX 102 can communicate with each other based on the WPC standard is almost similar to the power transmittable range. That is, in FIG. 1, the range 104 indicates the range where wireless power transmission and communication can be performed between the power transmission coil of the TX 101 and the power reception coil of the RX 102.

(Configurations of Apparatuses)

Next, the configurations of the power transmission apparatus 101 (the TX 101) and the power reception apparatus 102 (the RX 102) according to the present exemplary embodiment will be described. The configurations described below are merely examples, and part (or all in some cases) of the described configurations may be replaced with another configuration that serves another similar function, or may be omitted, and a further configuration may be added to the described configurations. Further, a single block illustrated in the following description may be divided into a plurality of blocks, or a plurality of blocks may be integrated into a single block.

Figure 2:
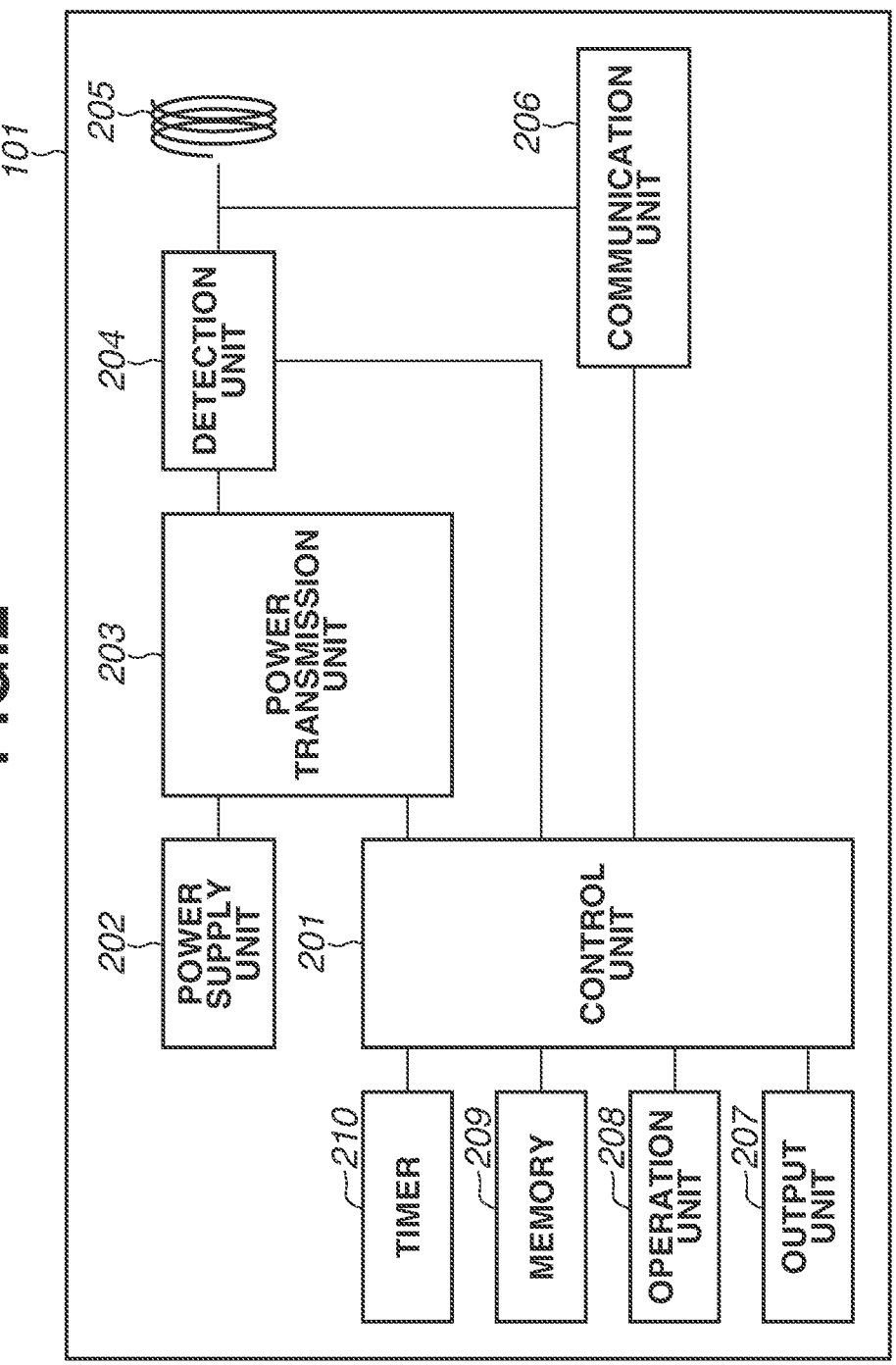
FIG. 2 is a diagram illustrating an example of a configuration of a power transmission apparatus.

FIG. 2 is a diagram illustrating an example of the configuration of the power transmission apparatus 101 (the TX 101) according to the present exemplary embodiment. The TX 101 includes a control unit 201, a power supply unit 202, a power transmission unit 203, a detection unit 204, a power transmission coil 205, a communication unit 206, an output unit 207, an operation unit 208, a memory 209, and a timer 210.

For example, the control unit 201 executes a control program stored in the memory 209, thereby controlling the entire TX 101. That is, the control unit 201 controls the function units illustrated in FIG. 2. The control unit 201 performs control regarding power reception control in the TX 101. As an example, the control unit 201 performs control required for device authentication and power transmission in the TX 101. The control unit 201 may perform control for executing an application other than wireless power transmission. The control unit 201 includes one or more processors such as a central processing unit (CPU) and a microprocessor unit (MPU). The control unit 201 may include hardware dedicated to a specific process, such as an application-specific integrated circuit (ASIC). Alternatively, the control unit 201 may include an array circuit such as a field-programmable gate array (FPGA) compiled to execute a predetermined process. The control unit 201 stores, in the memory 209, information that should be stored during the execution of various processes. The control unit 201 can measure time or a clock time using the timer 210. In a case where the detection unit 204 detects a foreign substance, then, based on the detection of the foreign substance, the control unit 201 restricts the power transmission unit 203 from transmitting power.

The power supply unit 202 transmits power required for control, power transmission, and communication to the entire TX 101. The power supply unit 202 is, for example, commercial power supply or a battery. The battery stores power transmitted from mains electricity.

The power transmission unit 203 converts direct current power or alternating current power input from the power supply unit 202 into alternating current frequency power in a frequency range for use in wireless power transmission. Further, the power transmission unit 203 inputs the alternating current frequency power to the power transmission coil 205, thereby generating an electromagnetic wave with which to cause the RX 102 to receive power. The frequency of the alternating current power generated by the power transmission unit 203 is approximately several hundreds of kilohertz (e.g., 110 kHz to 205 kHz).

Based on an instruction from the control unit 201, the power transmission unit 203 inputs alternating current frequency power to the power transmission coil 205 to cause the power transmission coil 205 to output an electromagnetic wave with which to transmit power to the RX 102. The power transmission unit 203 adjusts a voltage (a power transmission voltage) or a current (a power transmission current) to be input to the power transmission coil 205, thereby controlling the intensity of the electromagnetic wave to be output. The intensity of the electromagnetic wave becomes strong if the power transmission voltage or the power transmission current is made great. The intensity of the electromagnetic wave becomes weak if the power transmission voltage or the power transmission current is made small. Based on an instruction from the control unit 201, the power transmission unit 203 controls the output of the alternating current frequency power so that the transmission of power from the power transmission coil 205 is started or stopped. The power transmission unit 203 of the TX 101 according to the present exemplary embodiment includes a switch on a circuit connected to the power transmission coil 205. When a quality factor (a Q factor) is measured, the power transmission unit 203 switches the switch inside the power transmission unit 203 and disconnects the connection with the power transmission coil 205, thereby stopping the application of the voltage to the power transmission coil 205. The switch may be located at a position other than inside the power transmission unit 203. For example, the switch may be provided between the power transmission unit 203 and the detection unit 204 or between the detection unit 204 and the power transmission coil 205 in FIG. 2.

The detection unit 204 measures the voltage or the current of the power transmission coil 205, thereby detecting whether an object is present in the range 104. The detection unit 204 detects, for example, the voltage or the current of the power transmission coil 205 when the power transmission unit 203 transmits power with an analog ping in accordance with the WPC standard via the power transmission coil 205. If the voltage falls below a predetermined voltage value, or if the current value exceeds a predetermined current value, the detection unit 204 can determine that an object is present in the range 104. Then, the determination of whether this object is the RX 102 or a foreign substance other than the RX 102 is made. Specifically, if a predetermined response to a digital ping subsequently transmitted from the communication unit 206 is received, it is determined that this object is the RX 102. When the Q factor is acquired, the detection unit 204 measures the voltage of the power transmission coil 205. Then, using the Q factor acquired based on the measurement result, the detection unit 204 performs a determination process for determining whether a foreign substance is present in the power transmittable range (foreign substance detection). The details will be described below.

The communication unit 206 performs the above control communication based on the WPC standard with the RX 102. The communication unit 206 modulates an electromagnetic wave output from the power transmission coil 205 and transmits information to the RX 102. The communication unit 206 demodulates an electromagnetic wave output from the power transmission coil 205 and modulated by the RX 102, thereby acquiring information transmitted from the RX 102. That is, the communication performed by the communication unit 206 is superimposed on the transmission of power from the power transmission coil 205.

The output unit 207 provides information to a user by any technique such as a visual, auditory, or tactile technique. For example, the output unit 207 notifies the user of information indicating the state of the TX 101 or the state of the wireless power transmission system including the TX 101 and the RX 102 in FIG. 1. For example, the output unit 207 includes a liquid crystal display or a light-emitting diode (LED), a loudspeaker, a vibration generation circuit, and another notification device.

The operation unit 208 has a reception function for receiving an operation of the user on the TX 101. For example, the operation unit 208 includes a button, a keyboard, a sound input device such as a microphone, a motion detection device such as an acceleration sensor or a gyro sensor, and another input device. A device obtained by integrating the output unit 207 and the operation unit 208 as in a touch panel may be used.

The memory 209 stores various pieces of information. The memory 209 may store information obtained by a function unit different from the control unit 201. The timer 210 measures time using, for example, a count up timer that measures the time elapsed from the clock time when the count up timer is started, or a count down timer that counts down from a set time.

Figure 3:
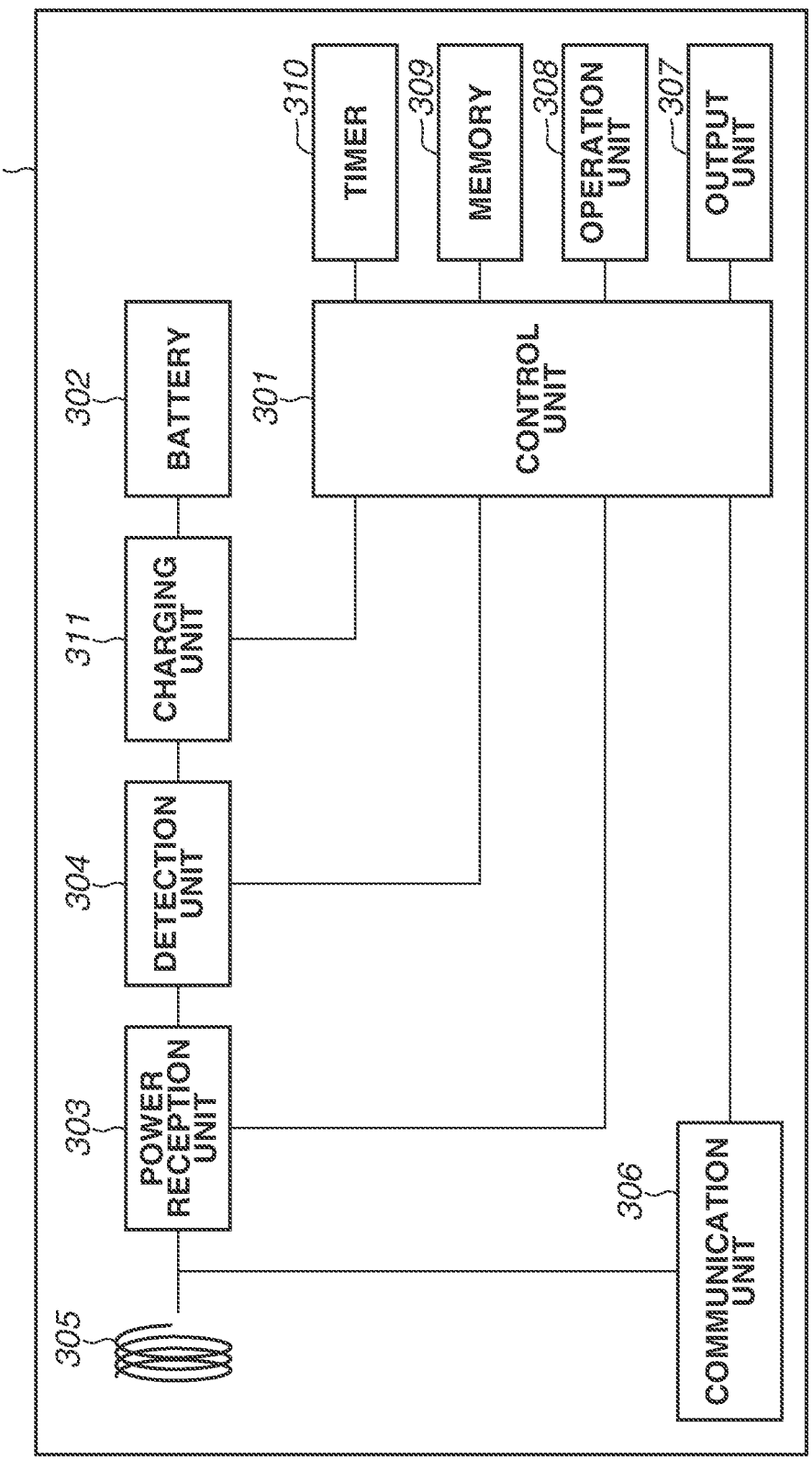
FIG. 3 is a diagram illustrating an example of a configuration of a power reception apparatus.

FIG. 3 is a diagram illustrating an example of the configuration of the power reception apparatus 102 (the RX 102) according to the present exemplary embodiment. The RX 102 includes a control unit 301, a battery 302, a power reception unit 303, a detection unit 304, a power reception coil 305, a communication unit 306, an output unit 307, an operation unit 308, a memory 309, a timer 310, and a charging unit 311.

The control unit 301 executes a control program stored in the memory 309, for example, thereby controlling the entire RX 102. As an example, the control unit 301 performs control required for device authentication and power reception in the RX 102. The control unit 301 may perform control for executing an application other than wireless power transmission. The control unit 301 includes one or more processors such as a CPU and an MPU. The control unit 201 may include hardware dedicated to a specific process, such as an ASIC, or an array circuit such as an FPGA compiled to execute a predetermined process. The control unit 301 stores, in the memory 309, information that should be stored during the execution of various processes. The control unit 301 can measure time using the timer 310.

The battery 302 transmits power required for control, power reception, and communication to the entire RX 102. The battery 302 stores power received via the power reception coil 305. In the power reception coil 305, an induced electromotive force is generated by an electromagnetic wave emitted from the power transmission coil 205 of the TX 101, and the power reception unit 303 acquires power generated in the power reception coil 305.

The power reception unit 303 acquires alternating current power generated by electromagnetic induction in the power reception coil 305. Then, the power reception unit 303 converts the alternating current power into direct current power or alternating current power of a predetermined frequency and outputs the power to the charging unit 311 that performs a process for charging the battery 302. That is, the power reception unit 303 transmits the power to a load in the RX 102. The above GP is the amount of power guaranteed to be output from the power reception unit 303.

The detection unit 304 detects whether the RX 102 is placed in the range 104 where the RX 102 can receive power from the TX 101. The detection unit 304 detects, for example, the voltage or the current of the power reception coil 305 when the power reception unit 303 receives power with a digital ping in accordance with the WPC standard via the power reception coil 305. If the detected voltage falls below a predetermined voltage threshold, or if the detected current value exceeds a predetermined current threshold, for example, the detection unit 304 can determine that the RX 102 is placed in the range 104.

The communication unit 306 performs the above-described control communication based on the WPC standard with the TX 101 through communication for superimposing a signal based on the WPC standard and using the same antenna (coil) as wireless power transmission. The communication unit 306 demodulates an electromagnetic wave input from the power reception coil 305, thereby acquiring information transmitted from the TX 101. The communication unit 306 further performs load modulation on the electromagnetic wave, thereby superimposing information that should be transmitted to the TX 101 on the electromagnetic wave. Consequently, the communication unit 306 communicates with the TX 101. That is, the communication performed by the communication unit 306 is superimposed on the transmission of power from the power transmission coil 205 of the TX 101 (FIG. 2).

The output unit 307 provides information to the user by any technique such as a visual, auditory, or tactile technique. For example, the output unit 307 notifies the user of the state of the RX 102 or the state of the wireless power transmission system including the TX 101 and the RX 102 in FIG. 1. For example, the output unit 307 includes a liquid crystal display or an LED, a loudspeaker, a vibration generation circuit, and another notification device.

The operation unit 308 has a reception function for receiving an operation of the user on the RX 102. For example, the operation unit 308 includes a button, a keyboard, a sound input device such as a microphone, a motion detection device such as an acceleration sensor or a gyro sensor, and another input device. A device obtained by integrating the output unit 307 and the operation unit 308 as in a touch panel may be used.

The memory 309 stores various pieces of information. The memory 309 may store information obtained by a function unit different from the control unit 301. The timer 310 measures time using, for example, a count up timer that measures the time elapsed from the clock time when the count up timer is started, or a count down timer that counts down from a set time.

Next, a description will be given of processing performed by the power transmission apparatus 101 (the TX 101) and the power reception apparatus 102 (the RX 102) according to the present exemplary embodiment with reference to the drawings.

<Flowchart of Power Transmission Apparatus>

Figure 4:
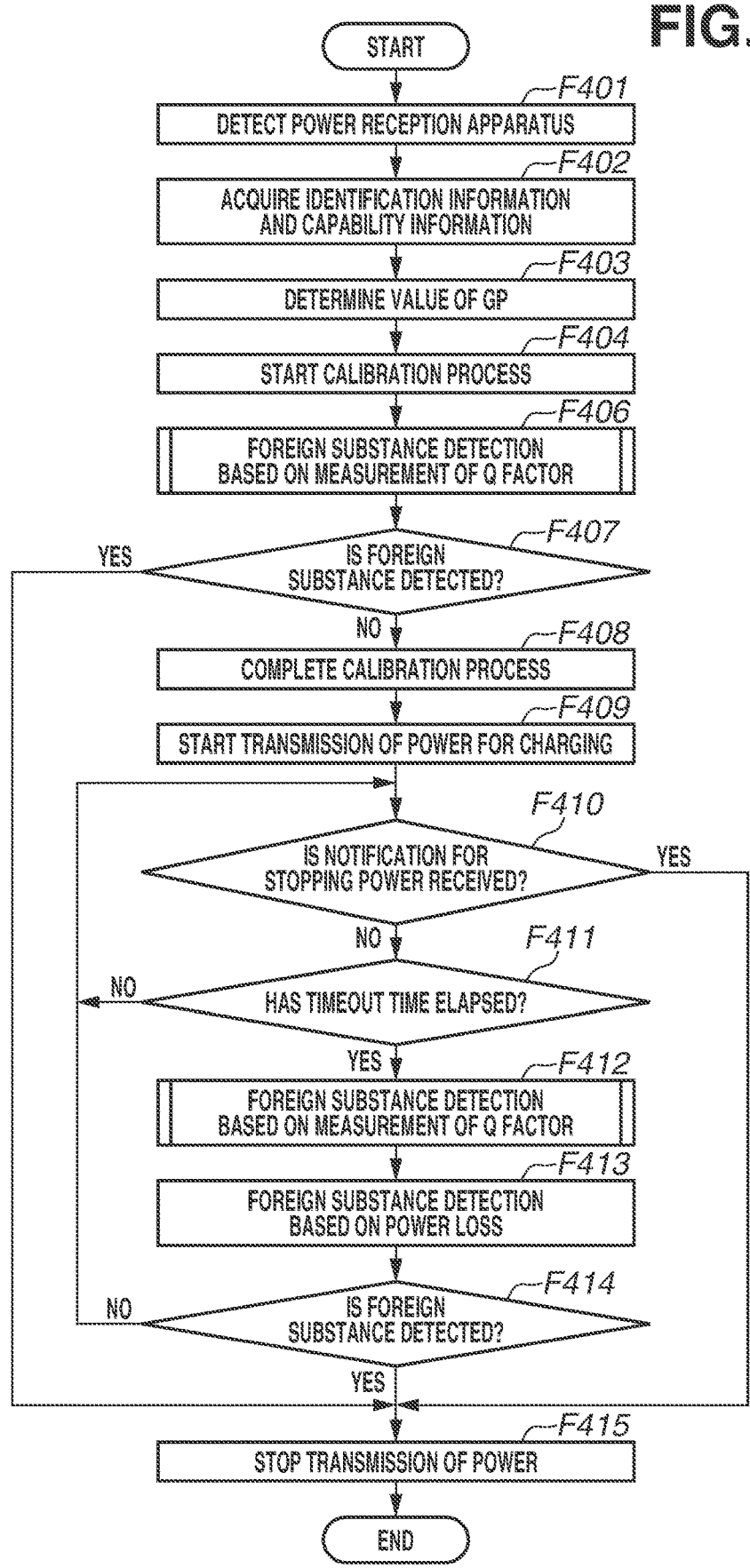
FIG. 4 is a flowchart illustrating processing executed by a power transmission apparatus according to a first exemplary embodiment.

Next, the operation of the power transmission apparatus 101 (the TX 101) according to the present exemplary embodiment will be described with reference to FIG. 4. Processing illustrated in FIG. 4 is achieved by the control unit 201 of the TX 101 executing a control program stored in the memory 209, calculating information, processing information, and controlling pieces of hardware.

In step F401, the control unit 201 executes processes defined as the selection phase and the ping phase in the WPC standard. Then, for example, the RX 102 detects a digital ping from the TX 101, thereby detecting that the RX 102 is placed on the charging stand 103 of the TX 101. Then, if the RX 102 detects the digital ping, the RX 102 transmits an SS packet including the value of a received voltage to the TX 101. The TX 101 detects that the RX 102 is placed in the power transmittable range of the TX 101.

In step F402, the control unit 201 performs communication in the I & C phase via the communication unit 206, thereby acquiring identification information and capability information from the RX 102. The identification information regarding the RX 102 can include a manufacturer code and a basic device ID. The capability information regarding the RX 102 can include information that allows the specifying of a version of the WPC standard the RX 102 is compliant with, a maximum power value indicating the maximum value of power that can be received by the RX 102, and information indicating whether the RX 102 has the negotiation function according to the WPC standard. The TX 101 may acquire the identification information and the capability information regarding the RX 102 by a method other than the communication in the I & C phase. The identification information may include information that allows the identification of the individuality of the RX 102, such as a wireless power ID. As described above, the identification information may include information other than the above. Similarly, the capability information may also include information other than the above.

In step F403, the control unit 201 performs communication in the negotiation phase via the communication unit 206, thereby determining the value of the GP based on the value of the GP requested by the RX 102.

In step F404, the control unit 201 starts a process in the calibration phase (hereinafter referred to as a "calibration process"). The calibration process is the process of, regarding power transmitted from the TX 101 to the RX 102, calibrating the correlation between the value of the power measured inside the TX 101 (transmission power) and the value of the power measured inside the RX 102 (reception power). In the calibration phase, the TX 101 transmits power for communicating information and acquiring the above correlation between the values of the power in the calibration process.

The processes of steps F404 to F407 are processes performed in the calibration phase. In these processes, the calculation of a Q factor to confirm that a foreign substance is not present in the power transmittable range, and foreign substance detection based on the calculated Q factor are performed. The TX 101 according to the present exemplary embodiment calculates the Q factor as a parameter for use in foreign substance detection. A method for measuring the Q factor in the time domain will be described with reference to FIG. 5A. A waveform illustrated in FIG. 5A indicates changes over time in the measured value of a voltage (hereinafter referred to as the "voltage value") inside the power transmission coil 205 of the TX 101. The horizontal axis represents time, and the vertical axis represents the voltage value. A waveform 500 indicates the voltage value of a high-frequency voltage applied to the power transmission coil 205. A clock time T0 indicates the clock time when the application of the high-frequency voltage to the power transmission coil 205 is stopped. A point 501 is a part of the envelope of the voltage value indicated by the waveform 500. Coordinates (T1, A1) corresponding to the point 501 indicate that the voltage value at a clock time T1 is A1. Similarly, a point 502 is a part of the envelope of the voltage value indicated by the waveform 500, and coordinates (T2, A2) corresponding to the point 502 indicate that the voltage value at a clock time T2 is A2.

Figure 5A:
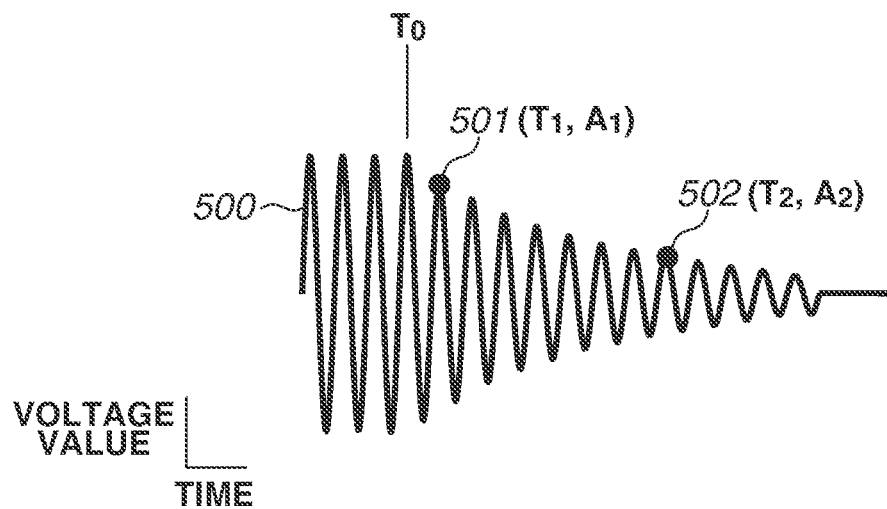
FIGS. 5A and 5B are diagrams illustrating a method for measuring a quality factor (a Q factor) according to one embodiment.

The Q factor is measured based on a change in the voltage value after the application of the high-frequency voltage to the power transmission coil 205 is stopped. In the example illustrated in FIG. 5A, the Q factor is acquired by measuring the amount of change in the voltage value after the clock time T0. In FIG. 5A, for example, the voltage values A1 and A2 at the clock times T1 and T2, respectively, which are clock times in a period after the clock time T0 when the application of the high-frequency voltage is stopped, are measured. Based on these clock times and measured voltages, the Q factor is calculated by equation 1.

$$Q=\omega(T2-T1)/2 \ln(A1/A2) \qquad \text{(equation 1)}$$

As described above, the Q factor is calculated based on the length of time from the clock time T1 to the clock time T2 and the ratio of the voltage value A1 corresponding to the clock time T1 to the voltage value A2 corresponding to the clock time T2. In equation 1, $\omega$ represents the angular velocity of the high-frequency voltage (obtained by multiplying the frequency by 2n).

Figure 5B:
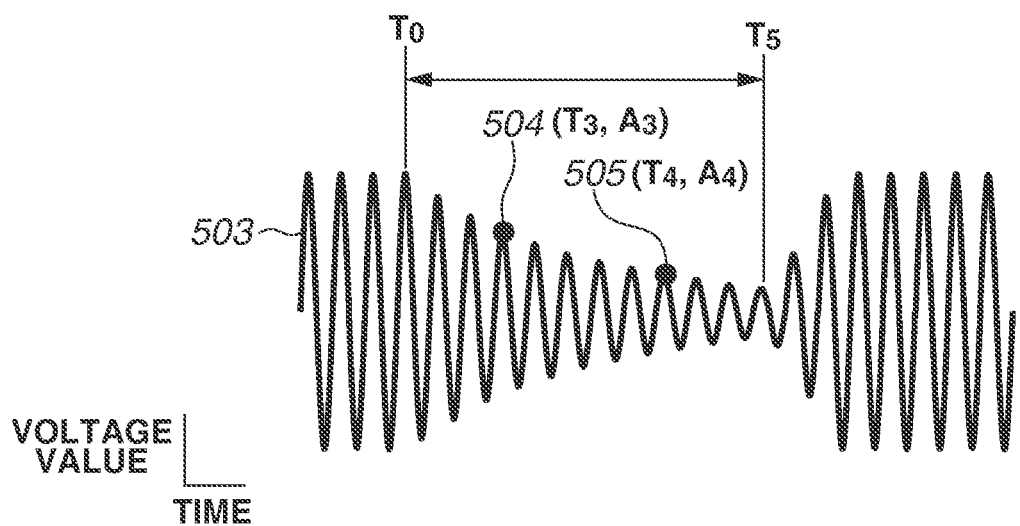

Next, a process for measuring the Q factor by the TX 101 according to the present exemplary embodiment will be described with reference to FIG. 5B. A waveform 503 indicates a high-frequency voltage applied from the power transmission unit 203 to the power transmission coil 205, and the frequency of the high-frequency voltage is a frequency between 110 kHz and 148.5 kHz, which is used in the WPC standard. In the period from a clock time T0 to a clock time T5, the power transmission unit 203 switches the switch and disconnects the connection with the power transmission coil 205, thereby stopping the application of the high-frequency voltage. The period from the clock time T0 to the clock time T5 is a period extremely short compared to the period during which the TX 101 transmits power to the RX 102.

Points 504 and 505 are parts of the envelope of the voltage value indicated by the waveform 503. The power transmission unit 203 stops the transmission of power in the period from the clock time T0 to the clock time T5, and the detection unit 204 measures the voltage value at a clock time T3 in this period and a clock time T4 after a predetermined time elapses from the clock time T3. In the example illustrated in FIG. 5B, the voltage value at the clock time T3 and the voltage value at the clock time T4 are A3 and A4, respectively. Using the clock time T3, the clock time T4, the voltage value A3, the voltage value A4, and the angular velocity of the high-frequency voltage, the TX 101 calculates the Q factor by equation 1. As described above, the detection unit 204 of the TX 101 measures the voltage value in the state where the power transmission unit 203 has stopped the transmission of power to the RX 102. Then, the detection unit 204 calculates the Q factor. The TX 101 switches the switch in the power transmission unit 203 at the clock time T5 and resumes the transmission of power.

The TX 101 according to the present exemplary embodiment acquires the Q factor by the above-described method. Based on the acquired Q factor, the TX 101 performs foreign substance detection and confirms that a foreign substance is not present in the power transmittable range. At this time, the TX 101 stores the Q factor measured in the state where a foreign substance is not present in the power transmittable range, as a reference value Qx in advance. If power is transmitted in a case where a foreign substance such as a conductor piece is present in the power transmittable range, not only the RX 102 but also the foreign substance consumes power. Consequently, it is assumed that in a case where a foreign substance is present, the voltage value when the TX 101 stops the transmission of power attenuates more than in a case where a foreign substance is not present. Consequently, it is assumed that the value of the Q factor based on equation 1 in a case where a foreign substance is present is smaller than that of the Q factor in a case where a foreign substance is not present. Thus, based on the fact that the acquired Q factor is smaller than the reference value Qx, the TX 101 determines that a foreign substance is present (detects a foreign substance). At this time, the TX 101 calculates the difference between the acquired Q factor and the reference value Qx. If the difference is greater than a predetermined threshold Th, the TX 101 determines that a foreign substance is present. If the difference between the acquired Q factor and the reference value Qx is smaller than the predetermined threshold Th, the TX 101 can confirm that a foreign substance is not present in the power transmittable range.

That is, if the following inequality 2 holds regarding the measured Q factor, the TX 101 determines that a foreign substance is present.

$$Q \leq Qx - Th \quad \text{(inequality 2)}$$

The communication unit 206 of the TX 101 according to the present exemplary embodiment modulates or demodulates an electromagnetic wave generated by the voltage applied from the power transmission unit 203 to the power transmission coil 205, thereby communicating information with the RX 102. The communication unit 306 of the RX 102 performs load modulation on an electromagnetic wave received by the power reception coil 305, thereby communicating information with the TX 101. Thus, if the voltage value is measured while the communication unit 206 and the communication unit 306 are in communication with each other, a voltage value appropriate for the acquisition of the Q factor for use in the foreign substance detection may not be measured. For example, if load modulation is performed in the period from the clock time T0 to the clock time T5 when the TX 101 stops the application of the voltage in FIG. 5B, there is a possibility that the voltage value changes compared to a case where load modulation is not performed. Consequently, there is a possibility that the values of the voltages A3 and A4 at the clock times T3 and T4 in a case where load modulation is performed are greater or smaller than the voltage values in a case where load modulation is not performed. If the Q factor acquired based on these voltage values is used in the foreign substance detection, there is a possibility that a foreign substance is not detected in a case where a foreign substance is present, or a foreign substance is erroneously detected in a case where a foreign substance is not present.

For the above reason, for example, in a case where foreign substance detection is performed based on the Q factor obtained by a single measurement, and if this single measurement is performed in the period during which the TX 101 and the RX 102 are in communication with each other, there is a possibility that the foreign substance detection cannot be performed with high accuracy. Thus, the TX 101 according to the present exemplary embodiment calculates the Q factor multiple times for the foreign substance detection, and based on each of the measurement results, determines whether a foreign substance is present. In the following description, the measurement of the voltage value for calculating the Q factor and the calculation of the Q factor based on the measured voltage value will occasionally be referred to collectively as "the measurement of the Q factor".

A foreign substance detection process based on the measurement of the Q factor according to the present exemplary embodiment will be described with reference to FIG. 6. FIG. 6 is a flowchart illustrating the operation of the foreign substance detection process in the power transmission apparatus 101 (the TX 101), and this process corresponds to steps F406 and F412 in FIG. 4. In step F601, the TX 101 according to the present exemplary embodiment measures the Q factor a predetermined number of times set in advance. In this case, the predetermined number of times is set to five times. In the following description, the predetermined number of times the Q factor is measured will be referred to as "the number of measurement times".

In step F602, the control unit 201 of the TX 101 controls the power transmission unit 203 to stop the application of the voltage to the power transmission coil 205. The detection unit 204 measures the voltage value in the period during which the application of the voltage is stopped. The control unit 201 controls the communication unit 206 of the TX 101 not to transmit a signal when the voltage value is measured. Based on the measured value of the voltage, the detection unit 204 calculates the Q factor. After stopping the application of the voltage and measuring the voltage value, the TX 101 resumes the application of the voltage. The TX 101 defines, as a single measurement of the Q factor, a measurement process for stopping the application of the voltage, measuring the voltage value at different timings (the clock times T3 and T4 in FIG. 5B), and resuming the application of the voltage. Then, the TX 101 repeatedly performs this measurement of the Q factor the number of measurement times. When the TX 101 repeatedly performs this measurement of the Q factor, in step F603, from the measurement of the Q factor to the next measurement of the Q factor, the TX 101 waits a random time for the execution of the next measurement of the Q factor within a predetermined time interval (e.g., 10 msec to 50 msec). The TX 101 repeats the processes of step F602 and F603 the number of measurement times. Consequently, a plurality of measurements of the Q factor is executed at random time intervals. In the example of FIG. 6, every time the single measurement process is performed, the Q factor is calculated. Embodiments of the present disclosure, however, are not limited to this implementation. The TX 101 can also perform a process for stopping the application of the voltage, measuring the voltage value at different timings, and resuming the application of the voltage five times, and then calculate the Q factor based on each measured value, for example, in other embodiments. That is, the calculation of the Q factor may be performed after the application of the voltage is resumed in some embodiments. In view of the possibility that a foreign substance is present, however, it is possible to detect the presence of a foreign substance earlier and respond to the foreign substance more quickly if the Q factor is calculated while the application of the voltage is stopped.

In step F604, regarding each of Q factors obtained by measuring the Q factor the predetermined number of times (five times in this case), using inequality 2, the detection unit 204 determines whether the difference between the measured Q factor and the reference value Qx exceeds the threshold Th. If the number of measured Q factors the difference of which from the reference value Qx exceeds the threshold Th is greater than or equal to a certain number (YES in step F604), then in step F605, the detection unit 204 determines that a foreign substance is present in the power transmittable range of the TX 101. If the number of measured Q factors the difference of which from the reference value Qx exceeds the threshold Th is less than the certain number (NO in step F604), then in step F606, the detection unit 204 determines that a foreign substance is not present in the power transmittable range of the TX 101. In the example of FIG. 6, the certain number is set to four.

By the above processing, the TX 101 can detect a foreign substance based on a plurality of measurement results of the Q factor. Consequently, even when any of the plurality of measurements of the Q factor is performed in the period during which the TX 101 and the RX 102 are in communication with each other, it is possible to prevent erroneous foreign substance detection from being performed by taking other measurement results into account.

Referring back to FIG. 4, in step F407, if a foreign substance is detected in the foreign substance detection process in step F406 (YES in step F407), then in step F415, the TX 101 stops the transmission of power. If a foreign substance is not detected in the foreign substance detection process in step F406 (NO in step F407), then in step F408, the calibration process is ended.

In step F409, the TX 101 transitions to the power transfer phase and starts the process of transmitting power for charging to the RX 102. After starting the transmission of power, the TX 101 continues the transmission of power until an end power transfer packet (hereinafter referred to as an "EPT") as a notification for stopping the transmission of power is transmitted from the RX 102. In a case where the TX 101 receives the EPT (YES in step F410), then in step F415, the TX 101 stops the transmission of power.

If the TX 101 has not received the EPT (NO in step F410), then in step F411, the TX 101 determines whether a predetermined time (hereinafter referred to as a "timeout time") has elapsed since the foreign substance detection process has been executed. If the timeout time has elapsed since the foreign substance detection process has been performed most recently, the TX 101 performs the foreign substance detection process again and thereby can periodically confirm whether a new foreign substance is placed in the power transmittable range. If the timeout time has not elapsed (NO in step F411), the TX 101 executes the process of step F410 again. If the timeout time has elapsed (YES in step F411), then in step F412, the TX 101 executes the foreign substance detection process based on the measurement of the Q factor. The foreign substance detection process performed at this time is a process similar to that of step F406.

In the power transfer phase, in step F412, the foreign substance detection based on the measurement of the Q factor is performed, and in step F413, foreign substance detection based on power loss are performed. The foreign substance detection based on power loss is the process of, if the value of power transmitted from the TX 101 is lost more than a predetermined amount, determining that a foreign substance is present. The foreign substance detection based on power loss is performed by notifying the TX 101 of power received by the RX 102. The foreign substance detection based on power loss can be executed after the calibration phase is completed, and can be executed at any timing between steps F410 and F414. For example, the foreign substance detection based on power loss may be executed at the same timing as or a different timing from the foreign substance detection based on the measurement of the Q factor. The order of steps F412 and F413 may be reversed.

A description will be given of the combined use of the foreign substance detection based on the measurement result of the Q factor and the foreign substance detection based on power loss. If both the result of the foreign substance detection based on the measurement result of the Q factor and the result of the foreign substance detection based on power loss indicate "a foreign substance is not present", the TX 101 determines that a foreign substance is not present. If, on the other hand, at least one of the result of the foreign substance detection based on the measurement result of the Q factor and the result of the foreign substance detection based on power loss indicates "a foreign substance is present", the TX 101 determines that (there is a high possibility that) a foreign substance is present. Consequently, it is possible to prevent the TX 101 from erroneously determining that a foreign substance is not present in a case where a foreign substance is present, and transmitting power.

If the result of the foreign substance detection based on the measurement result of the Q factor and the result of the foreign substance detection based on power loss are different from each other, the TX 101 may give priority to either one of the results of the foreign substance detection methods. For example, suppose that in a case where priority is given to the result of the foreign substance detection based on power loss, it is determined that "a foreign substance is not present" in the foreign substance detection based on the measurement result of the Q factor, and it is determined that "a foreign substance is present" in the foreign substance detection based on power loss. In this case, by giving priority to the result of the foreign substance detection based on power loss, the TX 101 determines that "a foreign substance is present". Similarly, priority may be given to the result of the foreign substance detection based on the measurement result of the Q factor. In the above method in which if it is determined that "a foreign substance is present" in at least one of a plurality of foreign substance detection methods, the TX 101 determines that "a foreign substance is present", the TX 101 is prevented from transmitting power when a foreign substance is present. In this method, however, there is also a possibility that the transmission of power is frequently restricted. Thus, in a case where a plurality of foreign substance detection methods is employed, it is determined in advance which of the results of the foreign substance detection methods priority is given to, whereby it can be expected that the transmission of power is not frequently restricted. It is not necessary to adopt a configuration in which both steps F412 and F413 are always executed. Alternatively, a configuration may be adopted in which at least one of steps F412 and F413 is executed.

If a foreign substance is not detected in the above foreign substance detection processes (NO in step F414), the TX 101 executes the processes of step F410 and the subsequent steps again. If a foreign substance is detected (YES in step F414), then in step F415, the TX 101 stops the transmission of power.

As described above, when the foreign substance detection based on the measurement of the Q factor is performed, the TX 101 determines whether a foreign substance is present based on a plurality of measurements of the Q factor. In this way, if any of the plurality of measurements of the Q factor is performed in the period during which the TX 101 and the RX 102 are in communication with each other, it is possible to prevent erroneous foreign substance detection from being performed by taking other measurement results into account. In a case where the foreign substance detection based on the measurement of the Q factor and the foreign substance detection based on power loss are performed in combination, the TX 101 can perform more reliable foreign substance detection. As the processing of the TX 101 in a case where a foreign substance is detected, the transmission of power may be restricted so that the transmission of power is stopped as described above, or the transmission of power may be restricted so that the transmission power is smaller than at the time when a foreign substance is not detected.

Alternatively, as the processing in a case where a foreign substance is detected, a configuration may be adopted in which the GP is determined again between the TX 101 and the RX 102. If the TX 101 determines that the RX 102 has the capability to renegotiate for the GP, the TX 101 transmits a signal instructing the RX 102 to renegotiate for determining the GP again. At this time, the TX 101 may notify the RX 102 of the negotiable maximum value of the GP. The negotiable maximum value of the GP may be limited to 5 W. If the TX 101 determines that the RX 102 does not have the capability to renegotiate for the GP, the TX 101 performs the process of restricting the transmission of power so that the transmission power is smaller than at the time when a foreign substance is not detected, or changing the value of the transmission power to a predetermined value (e.g., 5 W), or stopping the transmission of power.

A description will be given of the effect of the foreign substance detection based on the measurement of the Q factor on the foreign substance detection based on power loss. The foreign substance detection based on power loss cannot be executed unless the processes in the calibration phase for calculating parameters for use in the foreign substance detection are completed. That is, the foreign substance detection based on power loss cannot be used in the calibration phase. If a foreign substance is present in the power transmittable range at the stage of the calibration phase, there is a possibility that an inappropriate parameter is acquired and the accuracy of the foreign substance detection based on power loss in the subsequent power transfer phase decreases. In contrast, the foreign substance detection based on the measurement result of the Q factor can be executed even in the calibration phase. Thus, it can be determined whether a foreign substance is present at the stage of the calibration phase. Consequently, the TX 101 can determine that a foreign substance is present at the stage of the calibration phase, and restrict the transmission of power.

A modification of the first exemplary embodiment will be described. The configuration of a wireless charging system and the configurations of apparatuses in the wireless charging system are similar to those in the first exemplary embodiment, and therefore description thereof will be omitted. FIG. 7 is a flowchart illustrating a foreign substance detection process performed by the power transmission apparatus 101 (the TX 101) according to the modification of the first exemplary embodiment. The TX 101 according to this modification executes processing similar to the processing illustrated in FIG. 4, but executes processing illustrated in FIG. 7 in the foreign substance detection in steps F406 and F412. Description of a processing content similar to that in FIG. 4 will be omitted.

In step F701, similarly to the first exemplary embodiment, the TX 101 makes a setting to measure the Q factor a predetermined number of measurement times. In this case, the number of measurement times is set to five times. In step F702, the TX 101 measures the Q factor. The method for measuring the Q factor is similar to that in the first exemplary embodiment, and therefore description thereof will be omitted. After the TX 101 measures the Q factor, the TX 101 determines whether the difference between the measured Q factor and the reference value Qx exceeds the threshold Th. If the difference exceeds the threshold Th (YES in step F703), then in step F704, regarding Q factors acquired thus far by measuring the Q factor the number of measurement times (five times in this case), the TX 101 determines whether the difference from the reference value Qx exceeds the threshold Th as many times in succession as a predetermined number of times. In the following description, the predetermined number of times at this time will be referred to as "the number of successive times". The number of successive times regarding the measurement result of the Q factor the difference of which from the reference value Qx exceeds the threshold Th is defined as a first number of successive times. The number of successive times regarding the measurement result of the Q factor the difference of which from the reference value Qx does not exceed the threshold Th is defined as a second number of successive times. In the example of FIG. 7, the first number of successive times is four times, and the second number of successive times is twice.

In a case where the Q factor is measured at random time intervals, and if a plurality of Q factors the difference of which from the reference value Qx exceeds the threshold Th is obtained in succession, it is assumed that there is a high possibility that a foreign substance is present. Thus, if the difference between the measured Q factor and the reference value Qx exceeds the threshold Th as many times in succession as the first number of times (YES in step F704), then in step F708, the TX 101 determines that a foreign substance is present. At this time, even when the number of times the Q factor is measured is less than the number of measurement times, it is determined that a foreign substance is present. For example, if the number of times the Q factor is measured is four times and the difference from the reference value Qx exceeds the threshold Th regarding all the Q factors obtained by the respective measurements, it is determined that a foreign substance is present at this time. If Q factors the difference of which from the reference value Qx does not exceed the threshold Th are not obtained as many times in succession as the first number of successive times (NO in step F704), and if the number of times the Q factor is measured is less than the first number of successive times, then in step F706, the TX 101 waits a random time for the execution of the next measurement of the Q factor. The TX 101 repeats the measurement of the Q factor until the Q factor is measured the number of measurement times.

If the difference does not exceed the threshold Th in step F703 (NO in step F703), then in step F705, regarding Q factors acquired thus far by measuring the Q factor the number of measurement times, the TX 101 determines whether the difference from the reference value Qx does not exceed the threshold Th as many times in succession as the second number of successive times. In a case where the Q factor is measured at random time intervals, and if a plurality of Q factors the difference of which from the reference value Qx does not exceed the threshold Th is obtained in succession, it is assumed that there is a high possibility that a foreign substance is not present. Thus, if Q factors the difference of which from the reference value Qx does not exceed the threshold Th are obtained as many times in succession as the second number of successive times (YES in step F705), then in step F709, the TX 101 determines that a foreign substance is not present. At this time, even when the number of times the Q factor is measured is less than the number of measurement times, it is determined that a foreign substance is not present. If Q factors the difference of which from the reference value Qx does not exceed the threshold Th are not obtained as many times in succession as the second number of successive times (NO in step F705), and if the number of times the Q factor is measured is less than the second number of successive times, then in step F706, the TX 101 waits a random time for the execution of the next measurement of the Q factor. The TX 101 repeats the measurement of the Q factor until the Q factor is measured the number of measurement times.

If the determination is not YES in steps F704 and F705, and the Q factor is measured the number of measurement times, the TX 101 executes the process of step F707. The processes of step F707 to F709 are similar to the processes of steps F604 to F606 in the first exemplary embodiment, and therefore description thereof will be omitted. For example, in a case where the Q factor is measured five times, and if the obtained results of determining whether the difference between the measured Q factor and the reference value Qx exceeds the threshold Th are "exceeds", "exceeds", "does not exceed", "exceeds", and "exceeds" in this order, the process of step F707 is executed. In this example, since the difference exceeds the threshold Th the certain number of times (four times in this case) or more (YES in step F707), in step F708, it is determined that a foreign substance is present.

As described above, regarding the measured Q factor, the TX 101 according to this modification determines whether the difference from the reference value Qx exceeds the threshold Th as many times in succession as a predetermined number of times. The TX 101 performs the processes of steps F704 and F705, whereby, in a case where similar measured Q factors are obtained in succession, the TX 101 can reduce the number of times the Q factor is measured. Consequently, it is possible to reduce the processing load of the TX 101 related to foreign substance detection. In the above modification, a case has been described where the first number of successive times and the certain number are equal to each other. The second number of successive times is obtained by (the number of measurement times−the first number of successive times+1). Embodiments of the present disclosure, however, are not limited to this configuration. The TX 101 can independently set each of the first number of successive times and the second number of successive times to any value in other embodiments. For example, the TX 101 may set both the first number of successive times and the second number of successive times to four times. That is, it is possible to set the first number of successive times and the second number of successive times to any values less than or equal to the number of measurement times in some embodiments.

If a plurality of measured Q factors includes a certain number of Q factors the difference of which from the reference value Qx exceeds the threshold Th, the TX 101 according to each of the first exemplary embodiment and the modification of the first exemplary embodiment determines that a foreign substance is present. Embodiments of the present disclosure, however, are not limited to this. Alternatively, for example, if the ratio of the number of Q factors the difference of which from the reference value Qx exceeds the threshold Th to the number of measurement times set in advance is a certain ratio or more, the TX 101 may determine that a foreign substance is present. In addition, alternatively, if the number of Q factors the difference of which from the reference value Qx does not exceed the threshold Th is a certain number or more, the TX 101 may determine that a foreign substance is not present. Yet alternatively, the TX 101 may compare the number of Q factors the difference of which from the reference value Qx exceeds the threshold Th and the number of Q factors the difference of which from the reference value Qx does not exceed the threshold Th, and based on the results of the greater number of Q factors, the TX 101 may make a determination. In the above-described first exemplary embodiment and the modification of the first exemplary embodiment, the TX 101 measures the Q factor a predetermined number of times (the number of measurement times). Alternatively, the TX 101 may repeatedly measure the Q factor, for example, until a predetermined time elapses.

A second exemplary embodiment will be described. In the present exemplary embodiment, a description is given of the TX 101 that determines, in a case where the Q factor is measured for foreign substance detection, whether to use the measured Q factor in the foreign substance detection. The configuration of a wireless charging system and the configurations of apparatuses in the wireless charging system are similar to those in the first exemplary embodiment, and therefore description thereof will be omitted. FIG. 8 is a flowchart illustrating a foreign substance detection process performed by the power transmission apparatus 101 (the TX 101) according to the second exemplary embodiment. The TX 101 according to the present exemplary embodiment executes processing similar to the processing illustrated in FIG. 4, but executes processing illustrated in FIG. 8 in the foreign substance detection in steps F406 and F412. Description of a processing content similar to that in FIG. 4 will be omitted.

In step F801, the TX 101 measures the Q factor. The method for measuring the Q factor is similar to that in the first exemplary embodiment, and therefore description thereof will be omitted. In step F802, the TX 101 determines whether communication was performed at the timing when the voltage value of the power transmission coil 205 was measured to calculate the Q factor. The determination of whether communication was performed is made by determining whether a signal transmitted from the RX 102 is superimposed on the voltage in the period from the clock time T0 to the clock time T5 in the example of FIG. 5B. The communication unit 206 demodulates an electromagnetic wave generated in the power transmission coil 205 in the period from the clock time T0 to the clock time T5. Then, if a signal transmitted from the RX 102 is superimposed on the electromagnetic wave, the TX 101 determines that communication was performed in the period during which the application of the voltage was stopped. Thus, the communication unit 206 can determine that communication was performed at the timing when the voltage value of the power transmission coil 205 was measured.

If the voltage value of the power transmission coil 205 is measured in the period during which communication is performed, a voltage value appropriate for the acquisition of the Q factor for use in the foreign substance detection may not be measured. Thus, if it is determined that communication was performed during the measurement of the voltage value (YES in step F802), there is a possibility that the measured voltage value is inappropriate for the calculation of the Q factor for use in the foreign substance detection, and therefore, in step F801, the TX 101 measures the Q factor again. If it is determined that communication was not performed during the measurement of the voltage value (NO in step F802), the TX 101 determines that the measured voltage value is appropriate for the calculation of the Q factor for use in the foreign substance detection. Then, in step F803, the TX 101 performs a determination process in the foreign substance detection. In step F803, the TX 101 determines whether the difference between the measured Q factor and the reference value Qx exceeds the threshold Th. If it is determined that the difference exceeds the threshold Th (YES in step F803), then in step F804, the TX 101 determines that a foreign substance is present. If it is determined that the difference does not exceed the threshold Th (NO in step F803), then in step F805, the TX 101 determines that a foreign substance is not present.

As described above, if communication was performed at the timing when the voltage value of the power transmission coil 205 was measured to calculate the Q factor, the TX 101 according to the present exemplary embodiment does not use the Q factor based on this measured value in foreign substance detection, and measures the voltage value again. With this configuration, a voltage value likely to be inappropriate for a foreign substance detection process is not used. Thus, it is possible to prevent a decrease in the accuracy of the foreign substance detection process. While FIG. 8 illustrates an example of the processing in which the measurement of the voltage value of the power transmission coil 205 and the calculation of the Q factor based on the voltage value are performed in step F801, the calculation of the Q factor based on the voltage value may be performed after step F802.

A modification of the second exemplary embodiment will be described. The configuration of a wireless charging system and the configurations of apparatuses in the wireless charging system are similar to those in the first exemplary embodiment, and therefore description thereof will be omitted. FIG. 9 is a flowchart illustrating a foreign substance detection process performed by the power transmission apparatus 101 (the TX 101) according to the modification of the second exemplary embodiment. The TX 101 according to this modification executes processing similar to the processing illustrated in FIG. 4, but executes processing illustrated in FIG. 9 in the foreign substance detection in steps F406 and F412. Description of a processing content similar to that in FIG. 4 will be omitted.

In step F901, the TX 101 measures the Q factor. The method for measuring the Q factor is similar to that in the first exemplary embodiment, and therefore description thereof will be omitted. In step F902, the TX 101 monitors whether a signal transmitted from the RX 102 is received before the time when a certain time elapses from the timing when the voltage value of the power transmission coil 205 is measured to calculate the Q factor. The certain time at this time is the time assumed to be required from the start of the transmission of the signal from the RX 102 to the TX 101 to the completion of the transmission. If the RX 102 transmits as the signal, for example, data packets including information indicating power received by the RX 102, a predetermined time is required from the start of the transmission of the data packets to the completion of the transmission. The period during which the TX 101 stops the application of power to the power transmission coil 205 to calculate the Q factor may be a period shorter than the time required for the RX 102 to transmit the data packets. Thus, if the TX 101 stops the application of power to the power transmission coil 205 and measures the voltage value in the middle of the period when the RX 102 transmits the data packets, the remaining data packets are transmitted also after the timing when the voltage value is measured. The TX 101 can determine that communication is performed based on the reception of a data packet before the time when the time assumed to be required for the RX 102 to transmit the data packets elapses from the clock time when the application of power is stopped.

If the TX 101 receives a signal such as a data packet before the time when the certain time elapses, the TX 101 determines that communication was performed (YES in step F903). Then, there is a possibility that the measured voltage value is inappropriate for the calculation of the Q factor for use in the foreign substance detection, and therefore, in step F901, the TX 101 measures the Q factor again. If the TX 101 does not receive a signal such as a data packet before the time when the certain time elapses, the TX 101 determines that communication was not performed (NO in step F903). Then, the TX 101 determines that the measured voltage value is appropriate for the calculation of the Q factor for use in the foreign substance detection. Then, in step F904, the TX 101 performs a determination process in the foreign substance detection. The processes of steps F904 to F906 are similar to the processes of steps F803 to F805 in FIG. 8, and therefore description thereof will be omitted.

As described above, the TX 101 according to this modification determines whether communication was performed based on the reception of a signal within a certain time from the timing when the voltage value of the power transmission coil 205 is measured to calculate the Q factor. The TX 101 according to the second exemplary embodiment is configured to determine whether communication is performed in the period during which the application of the voltage is stopped. However, the time during which the application of the voltage is stopped is a period extremely short compared to the time required for the communication. Thus, to detect the communication status in the period during which the application of the voltage is stopped, the accuracy of the detection needs to be a certain level or more. According to this modification, it is only necessary to enable the detection of the communication status in a longer time, and thus, for example, it is possible to analyze the communication status using a processing program operating in the control unit 201.

Although FIG. 9 illustrates an example of the processing in which the measurement of the voltage value of the power transmission coil 205 and the calculation of the Q factor based on the voltage value are performed in step F901, the calculation of the Q factor based on the voltage value may be performed after step F902.

If communication was performed at the timing when the voltage value of the power transmission coil 205 was measured to calculate the Q factor, the TX 101 according to each of the second exemplary embodiment and the modification of the second exemplary embodiment does not use the Q factor based on this measured value in foreign substance detection. Embodiments of the present disclosure, however, are not limited to this configuration. For example, by giving a lower priority to the Q factor based on the voltage value measured in the period during which communication is performed than the Q factor based on the voltage value measured in the period during which communication is not performed, the TX 101 can use the Q factor based on the voltage value measured in the period during which communication is performed in other embodiments. For example, in a case where the Q factor is measured multiple times as in the first exemplary embodiment, first, the TX 101 performs the process of determining whether a foreign substance is present based on the Q factor based on the voltage value measured in the period during which communication is not performed. Next, the TX 101 can confirm and correct the result of the determination process using the measurement result of the Q factor based on the voltage value measured in the period during which communication is performed. Alternatively, the TX 101 may estimate in advance the voltage value that changes by communication being performed, and based on the estimated value, correct the measurement result of the Q factor based on the voltage value measured in the period during which communication is performed, and use the corrected measurement result, in some embodiments.

Other Exemplary Embodiments

The above-described foreign substance detection based on the measurement of the Q factor is performed every time the timeout time elapses. Embodiments of the present disclosure, however, are not limited to this configuration. Alternatively, for example, a configuration may be employed in which the foreign substance detection based on the measurement of the Q factor is performed at the timing when a user operation is performed on the TX 101 or the RX 102, in addition to every time the timeout time elapses in other embodiments. In addition, alternatively, for example, the TX 101 may include a sensor for detecting a vibration, the temperature, or the weight of an object placed in the power transmittable range, and when a vibration, a rise in the temperature, or a change in the weight is detected, foreign substance detection may be executed, in some embodiments.

The parameters such as the reference value Qx, the threshold Th, the timeout time, the number of measurement times, the certain number, the predetermined time intervals, the number of successive times, the predetermined time, and the certain time used in the above exemplary embodiments are fixed values determined in advance. Embodiments of the present invention, however, are not limited to these features. These parameters may dynamically change according to the state of the apparatus, a change in the surrounding environment, or the execution state of the processing, for example. For example, these parameters may be determined by negotiation between the TX 101 and the RX 102 in the negotiation phase.

The TX 101 according to each of the above exemplary embodiments measures the Q factor based on a change of the voltage inside the power transmission coil 205 over time. Embodiments of the present disclosure, however, are not limited to this method. The TX 101 can also measure the Q factor based on a change of the current inside the power transmission coil 205 over time in other embodiments. In this case, the TX 101 measures a current value A3 at the clock time T3 and a current value A4 at the clock time T4, and using the measured current values A3 and A4 and the frequency of a high-frequency current, calculates the Q factor based on equation 1, for example.

Alternatively, the TX 101 may perform foreign substance detection without calculating the Q factor. In FIG. 5B, for example, the TX 101 measures voltage values A1 and A2 at the clock times T3 and T4 in the period during which the application of the voltage to the power transmission coil 205 is stopped. Based on the difference (the slope) between the voltage values A1 and A2 in the period from the clock time T3 to the clock time T4 based on the measurement results, the TX 101 determines whether a foreign substance is present. It is assumed that in a case where a foreign substance is present in the power transmittable range, the voltage value of the power transmission coil 205 attenuates more than in a case where a foreign substance is not present.

Thus, if the difference (the slope) between the measured voltages is greater by a certain amount than a reference value acquired in a case where a foreign substance is not present (the difference between the voltages at two clock times), the TX 101 determines that a foreign substance is present. Alternatively, the TX 101 can perform foreign substance detection also by obtaining the ratio between the voltage values A1 and A2. For example, if the ratio of the voltage A1 at the clock time T1 to the voltage A2 at the clock time T2 is greater by a certain amount than a reference value acquired in a case where a foreign substance is not present (the ratio between the voltages at two clock times), the TX 101 determines that a foreign substance is present.

In a case where foreign substance detection is performed without calculating the Q factor as described above, it is possible that the difference and the ratio between the voltages to be calculated differ according to the magnitude of the voltage applied to the power transmission coil 205 or the timing when the voltage is measured. Thus, the magnitude of the voltage and the timing when the voltage is measured are made the same as the conditions when the reference value is acquired, whereby it is possible to perform more secure foreign substance detection.

The TX 101 according to each of the above exemplary embodiments measures one or both of a voltage and a current output from the power transmission coil 205 and performs foreign substance detection based on the measurement result. Embodiments of the present invention, however, are not limited to this configuration. For example, a configuration may be employed in which another apparatus externally connected to the TX 101 measures and calculates a voltage, a current, and power output from the power transmission coil 205, and energy accumulated in a capacitor in the TX 101 and provides the obtained values to the TX 101 in other embodiments. The TX 101 can perform foreign substance detection based on the values provided by another apparatus, for example.

The TX 101 according to each of the above exemplary embodiments is configured to, when the Q factor is measured, switch the switch in the power transmission unit 203 and disconnect the connection with the power transmission coil 205, thereby stopping the application of the voltage to the power transmission coil 205. Embodiments of the present disclosure, however, are not limited to this configuration. Alternatively, for example, when the Q factor is measured, the power transmission unit 203 may set the power transmission voltage to 0, thereby stopping the application of the voltage, in other embodiments. In addition, alternatively, a configuration may be employed in which when the Q factor is measured, the power transmission voltage is not completely set to 0, but is switched to a lower voltage value, for example. However, in some embodiments, since the method for measuring the Q factor according to the present exemplary embodiment calculates the Q factor based on the degree of the attenuation of the voltage value, the power transmission voltage is reduced to at least a voltage value that enables the observation of the attenuation of the voltage value, whereby it is possible to measure the Q factor without completely stopping the application of the voltage. At this time, if the period during which the voltage is reduced exceeds a certain time, there is a possibility that the RX 102 determines that an error has occurred in the TX 101. Thus, it is desirable to set the range of reduction in the voltage value that enables the measurement of the attenuation of the voltage in the period during which the RX 102 does not determine that the TX 101 is abnormal.

The TX 101 according to each of the above exemplary embodiments stops the voltage and measures the Q factor, thereby performing foreign substance detection. In each of the exemplary embodiments, however, there is a possibility that the RX 102 determines that an error has occurred in the TX 101 by stopping the voltage. Thus, a description is given of a method for solving the above issue by the RX 102 acquiring information regarding the TX 101 when the RX 102 is placed in the power transmittable range of the TX 101.

For example, through communication in the negotiation phase, the RX 102 transmits to the TX 101 a signal instructing the TX 101 to transmit information regarding the TX 101. The information regarding the TX 101 includes version information regarding the TX 101, information regarding a standard w the TX 101 is compliant with, and information regarding a foreign substance detection method employed by the TX 101. The TX 101 transmits the information regarding the TX 101 to the RX 102. Based on the acquired information, the RX 102 recognizes that the TX 101 stops the voltage for a predetermined period to measure the Q factor. Consequently, in a case where the TX 101 stops the application of the voltage to measure the Q factor, it is possible to prevent the RX 102 from erroneously determining that an error has occurred in the TX 101, and stably continue a charging process.

According to the present disclosure, in a case where foreign substance detection is performed based on the measurement result of a voltage or a current in the period during which the transmission of power is stopped, it is possible to prevent a decrease in the detection accuracy.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the exemplary embodiments have been described, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-022902, filed Feb. 13, 2020, which is hereby incorporated by reference herein in its entirety.

What is claimed is:

1. A power transmission apparatus comprising:
   a communication unit configured to wirelessly communicate with a power reception apparatus using an antenna;
   a power transmission unit configured to wirelessly transmit power to the power reception apparatus using the antenna;
   a measurement unit configured to, in a period during which the transmission of the power from the power transmission unit is stopped, measure one or both of a voltage and a current output from the antenna;
   a first determination unit configured to perform, based on a measurement result obtained by the measurement performed by the measurement unit, a determination process for determining that an object different from the power reception apparatus is present;
   a restriction unit configured to, in a case where it is determined that an object different from the power reception apparatus is present as a result of the determination process performed by the first determination unit, restrict the transmission of the power from the power transmission unit; and
   a control unit configured to control the first determination unit not to use in the determination process the measurement result obtained by the measurement performed by the measurement unit in a period during which communication is performed by the communication unit.

2. The power transmission apparatus according to claim 1, wherein, in a case where the measurement unit performs the measurement in the period during which communication is performed by the communication unit, the control unit controls the measurement unit to perform the measurement again.

3. The power transmission apparatus according to claim 2, further comprising a second determination unit configured to determine whether communication is performed by the communication unit at a timing when the measurement is performed by the measurement unit,
   wherein, in a case where the second determination unit determines that communication is performed by the communication unit at the timing when the measurement is performed by the measurement unit, the control unit controls the measurement unit to perform the measurement again.

4. The power transmission apparatus according to claim 3, wherein, in a case where communication is performed by the communication unit in the period during which the transmission of the power from the power transmission unit is stopped, the second determination unit determines that communication is performed by the communication unit at the timing when the measurement is performed by the measurement unit.

5. The power transmission apparatus according to claim 3, wherein, in a case where communication is performed by the communication unit in a period from a timing when the measurement is performed by the measurement unit to a time when a certain time elapses, the second determination unit determines that communication is performed by the communication unit at the timing when the measurement is performed by the measurement unit.

6. The power transmission apparatus according to claim 5, wherein the certain time is a time based on a time required from when the communication unit starts reception of a signal transmitted from the power reception apparatus to when the communication unit ends the reception of the signal.

7. The power transmission apparatus according to claim 1,
wherein the measurement unit measures the voltage output from the antenna at a first timing in the period during which the transmission of the power from the power transmission unit is stopped and a second timing after the first timing in the period during which the transmission of the power from the power transmission unit is stopped, and
wherein the first determination unit determines, based on the first timing, the second timing, a measured value of the voltage output from the antenna based on the first timing, and a measured value of the voltage output from the antenna based on the second timing, that an object different from the power reception apparatus is present.

8. The power transmission apparatus according to claim 1,
wherein the measurement unit measures the current output from the antenna at a first timing in the period during which the transmission of the power from the power transmission unit is stopped and a second timing after the first timing in the period during which the transmission of the power from the power transmission unit is stopped, and
wherein the first determination unit determines, based on the first timing, the second timing, a measured value of the current output from the antenna based on the first timing, and a measured value of the current output from the antenna based on the second timing, that an object different from the power reception apparatus is present.

9. The power transmission apparatus according to claim 7, wherein the first determination unit determines, based on a length of time from the first timing to the second timing and a ratio of the measured value based on the first timing to the measured value based on the second timing, that an object different from the power reception apparatus is present.

10. The power transmission apparatus according to claim 9, wherein, in a case where a quality factor calculated based on the length of time from the first timing to the second timing and the ratio of the measured value based on the first timing to the measured value based on the second timing is smaller than a predetermined reference, the first determination unit determines that an object different from the power reception apparatus is present.

11. The power transmission apparatus according to claim 10, wherein the predetermined reference is information based on a result of the measurement performed by the measurement unit in a state where an object different from the power reception apparatus is not present.

12. The power transmission apparatus according to claim 7, wherein, in a case where a difference between the measured value based on the first timing and the measured value based on the second timing is greater than a predetermined reference, the first determination unit determines that an object different from the power reception apparatus is present.

13. The power transmission apparatus according to claim 1, wherein, in a case where it is determined that an object different from the power reception apparatus is present, the restriction unit restricts the transmission of the power from the power transmission unit so that the power transmitted from the power transmission unit is smaller than in a case where it is not determined that an object different from the power reception apparatus is present.

14. The power transmission apparatus according to claim 1, wherein in a case where it is determined that an object different from the power reception apparatus is present, the restriction unit restricts the power transmission unit from transmitting the power.

15. The power transmission apparatus according to claim 1, wherein the first determination unit determines that an object different from the power reception apparatus is present in an area where the power transmission unit can transmit power to the power reception apparatus.

16. A method for controlling a power transmission apparatus, the method comprising:
wirelessly communicating with a power reception apparatus using an antenna;
wirelessly transmitting power to the power reception apparatus using the antenna;
measuring, in a period during which the transmission of the power is stopped, one or both of a voltage and a current output from the antenna;
performing, based on a measurement result obtained by the measurement, a determination process for determining that an object different from the power reception apparatus is present;
restricting the transmission of the power, in a case where it is determined that an object different from the power reception apparatus is present in the determination process; and
performing control not to use in the determination process the measurement result obtained by the measurement in a period during which communication is performed.

17. A non-transitory computer-readable storage medium storing a program for causing a computer to execute a method, the method comprising:
wirelessly communicating with a power reception apparatus using an antenna;
wirelessly transmitting power to the power reception apparatus using the antenna;
measuring, in a period during which the transmission of the power is stopped, one or both of a voltage and a current output from the antenna;
performing, based on a measurement result obtained by the measurement, a determination process for determining that an object different from the power reception apparatus is present;
restricting the transmission of the power, in a case where it is determined that an object different from the power reception apparatus is present in the determination process; and
performing control not to use in the determination process the measurement result obtained by the measurement in a period during which communication is performed.

* * * * *